United States Patent
Kim

(10) Patent No.: US 11,018,010 B2
(45) Date of Patent: May 25, 2021

(54) MASK LAYOUT, SEMICONDUCTOR DEVICE AND MANUFACTURING METHOD USING THE SAME

(71) Applicant: MagnaChip Semiconductor, Ltd., Cheongju-si (KR)

(72) Inventor: Guk Hwan Kim, Cheongju-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 16/529,183

(22) Filed: Aug. 1, 2019

(65) Prior Publication Data
US 2020/0312666 A1 Oct. 1, 2020

(30) Foreign Application Priority Data
Mar. 29, 2019 (KR) .................. 10-2019-0037441

(51) Int. Cl.
*H01L 21/28* (2006.01)
*H01L 29/06* (2006.01)
*H01L 29/417* (2006.01)
*H01L 29/66* (2006.01)

(52) U.S. Cl.
CPC .... *H01L 21/28123* (2013.01); *H01L 29/0653* (2013.01); *H01L 29/41775* (2013.01); *H01L 29/66477* (2013.01)

(58) Field of Classification Search
CPC .......... H01L 21/28123; H01L 29/0653; H01L 29/41775; H01L 29/66477; H01L 21/027–0338; H01L 21/0273–0279; H01L 21/312–3128; H01L 29/42368; H01L 27/0207; H01L 29/456;
(Continued)

(56) References Cited

U.S. PATENT DOCUMENTS 6,476,449 B1 * 11/2002 Lin .................. H01L 21/28518
257/360
9,595,590 B2 3/2017 Ryu et al.
(Continued)

FOREIGN PATENT DOCUMENTS

KR 10-2009-0073487 A 7/2009

OTHER PUBLICATIONS

Korean Office Action dated Jul. 21, 2020 in corresponding Korean Patent Application No. 10-2019-0037441 (8 pages in Korean).

*Primary Examiner* — Shahed Ahmed
(74) *Attorney, Agent, or Firm* — NSIP Law

(57) ABSTRACT

A mask layout for forming a semiconductor device includes an active mask pattern, a gate electrode mask pattern, a silicide blocking mask pattern, and a contact mask pattern. The active mask pattern forms source and drain regions in a substrate. The gate electrode mask pattern, disposed to overlap the active mask pattern, forms a gate electrode between the source region and the drain region. The silicide blocking mask pattern is disposed to overlap the gate electrode mask pattern and the active mask pattern in the gate electrode, the source region, and the drain regions to form a silicide blocking region. The contact mask pattern, disposed spaced apart from the silicide blocking mask pattern, forms a contact plug on the substrate. The silicide blocking mask pattern covers the gate electrode mask pattern and extends to the active mask pattern.

15 Claims, 15 Drawing Sheets

(58) Field of Classification Search
CPC ......... H01L 21/28518; H01L 21/28052; H01L 29/1087; H01L 29/7835
See application file for complete search history.

(56) References Cited

U.S. PATENT DOCUMENTS

| | | | |
|---|---|---|---|
| 2007/0114596 A1* | 5/2007 | Candelier | H01L 27/11206 257/324 |
| 2009/0166765 A1* | 7/2009 | Lee | H01L 29/665 257/409 |
| 2009/0294857 A1* | 12/2009 | Lee | H01L 27/10876 257/365 |
| 2011/0266630 A1* | 11/2011 | Suligoj | H01L 29/1008 257/370 |
| 2012/0205744 A1* | 8/2012 | O | H01L 29/66772 257/352 |
| 2014/0054642 A1 | 2/2014 | Edwards et al. | |
| 2019/0237485 A1* | 8/2019 | Chu | H01L 29/6659 |

* cited by examiner

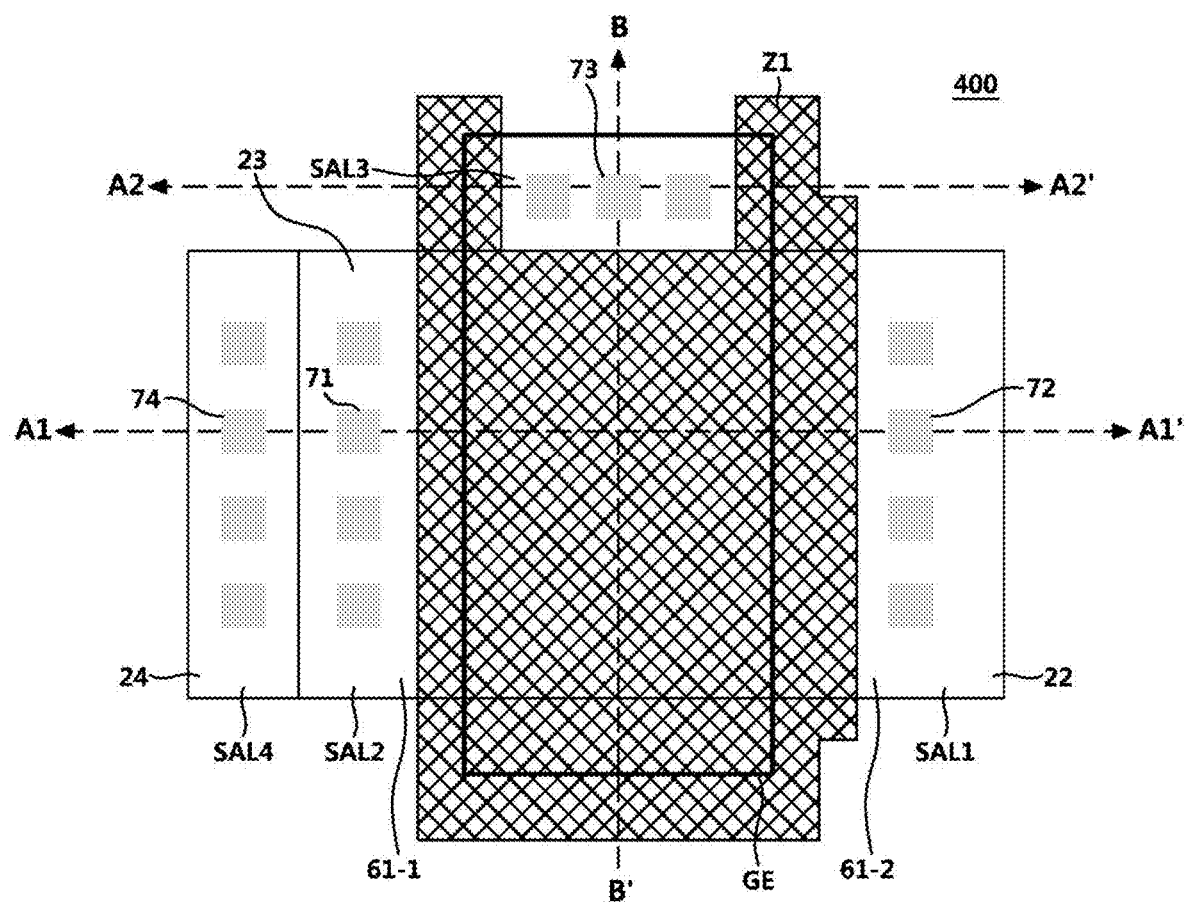

MASK LAYOUT, SEMICONDUCTOR DEVICE AND MANUFACTURING METHOD USING THE SAME

CROSS-REFERENCE TO RELATED APPLICATIONS

This application claims the benefit under 35 U.S.C. 119(a) of Korean Patent Application No. 10-2019-0037441 filed on Mar. 29, 2019 in the Korean Intellectual Property Office, the entire disclosure of which is incorporated herein by reference for all purposes.

BACKGROUND

1. Field

The following description relates to a mask layout and a method of manufacturing a semiconductor device using the same, and more particularly, a mask layout used in a level shifter block of a display driver IC and a method of manufacturing a semiconductor device using the same.

2. Description of Related Art

A level shifter circuit refers to a circuit that changes the voltage level inside a semiconductor chip such as a display driver IC (DDI). For example, a level shift circuit is used to change a low voltage (LV) signal to a middle voltage (MV) or a high voltage (HV) signal. That is, a level shift circuit is a circuit which is located between the dissimilar voltages having different voltages.

ESD events involving IC can cause damage or destruction of the circuitry thereon if it is not otherwise protected. As is further discussed below, some ESD circuits may be designed according to a human body model (HBM), while others may be designed according to a charged device model (CDM). Such circuits may have different characteristics that, when used together, allow both the discharge of significant amounts of electrical current as well as keeping discharge paths open for a sufficient duration. A high voltage operating device and a low voltage operating device are fabricated in one chip. In a level shifter circuit, a high voltage-operating device is implemented using an Extended Drain MOS (EDMOS) structure. Electrical Overstress (EOS) related failures caused by charged device model (CDM) are easily observed in an n-type EDMOS (hereinafter referred to as an nEDMOS semiconductor device) used in a level shifter. EOS refers to damage to a device when a voltage or current over a limitation of tolerance is generated. If EOS stress level is increased excessively, EOS related failure may occur in a middle voltage level shifter in a channel decoder. Thus, when a failure occurs in the middle voltage level shifter, which is a chip core block, the abnormal display data decide a source output due to a level shifter failure, causing line dim failure.

A failure caused by EOS is known to occur in the silicide region of an EDMOS device, for example. It is presumably due to a migration of the silicide existing in the gate electrode due to the excessive current. Therefore, EOS may be easily introduced into the source region, which is located closer to the gate electrode, and a failure occurs. The silicide region lowers the resistance and helps the current flow. The silicide region is disposed on most of the source region, and the gate-source resistance becomes lower than the gate-drain resistance.

Therefore, the design of a silicide blocking region may be desired to reduce the current toward the source region when EOS occurs.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a mask layout for forming a semiconductor device includes an active mask pattern, a gate electrode mask pattern, a silicide blocking mask pattern, and a contact mask pattern. The active mask pattern forms source and drain regions in a substrate. The gate electrode mask pattern, disposed to overlap the active mask pattern, forms a gate electrode between the source region and the drain region. The silicide blocking mask pattern is disposed to overlap the gate electrode mask pattern and the active mask pattern in the gate electrode, the source region, and the drain regions to form a silicide blocking region. The contact mask pattern, disposed spaced apart from the silicide blocking mask pattern, forms a contact plug on the substrate. The silicide blocking mask pattern covers the gate electrode mask pattern and extends to the active mask pattern.

The silicide blocking region in the gate electrode may be larger than the silicide region.

The source region may be simultaneously in contact with both the silicide region and the silicide blocking region.

The silicide blocking mask pattern may include a body region and a plurality of protruding regions.

The width of the protruding region may be smaller than the width of the body region.

The silicide blocking region may be disposed from the top surface of the gate electrode and extends to a part of the top surface of the source region.

In another general aspect, a method of manufacturing a semiconductor device includes forming a gate insulating film on a substrate, forming a gate electrode on the gate insulating film, forming a source region and a drain region on the opposite ends of the gate electrode, forming a first insulating film on the gate electrode, the source region, and the drain region, forming a silicide blocking film on the gate electrode, the source region, and the drain region by patterning the first insulating film, and forming a silicide film on the gate electrode, a portion of the source region, and a portion of the drain region.

The silicide blocking film may be formed extending from the gate electrode to the source and drain regions.

A gate electrode mask pattern, disposed to overlap an active mask pattern, may form a gate electrode between the source region and the drain region.

The active mask pattern may be used to form the source region and the drain region on the opposite ends of the gate electrode.

A silicide blocking mask pattern may be disposed to overlap the gate electrode mask pattern and the active mask pattern in the gate electrode, the source region, and the drain regions to form the silicide blocking film.

In another general aspect, a semiconductor device includes an active region, a gate electrode, and a gate silicide region and a silicide blocking region. The active region defines an isolation region, a source region, and a drain region in a substrate. The gate electrode is disposed, between the source region and the drain region, to overlap the active region. The gate silicide region and the silicide blocking region are disposed on the gate electrode. The silicide blocking region includes a body region and a plurality of protruding regions extended from the body region. A width of the protruding region is less than a width of the body region.

A first protruding silicide blocking region may be disposed in the gate electrode and a portion of the source region. A second protruding silicide blocking region may be disposed in the gate electrode and a portion of the drain region.

The plurality of protruding regions may further include a third protruding silicide blocking region protruded towards the drain region. The silicide blocking region may be disposed in contact with the second protruding silicide blocking region.

The body region may be disposed to overlap the gate electrode, a portion of the source region, and a portion of the drain region.

The body region may be disposed to overlap a portion of the gate electrode and the drain region.

An active mask pattern may form the source region and the drain region in the substrate.

A gate electrode mask pattern, disposed to overlap the active mask pattern, may form the gate electrode.

A silicide blocking mask pattern disposed to overlap the gate electrode mask pattern and the active mask pattern in the gate electrode, the source region, and the drain regions may form the silicide blocking region.

The silicide blocking mask pattern may cover the gate electrode mask pattern and extend to the active mask pattern.

Other features and aspects will be apparent from the following detailed description, the drawings, and the claims.

BRIEF DESCRIPTION OF THE DRAWINGS

FIGS. 3A and 3B illustrate an example of a mask layout for forming a semiconductor device.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
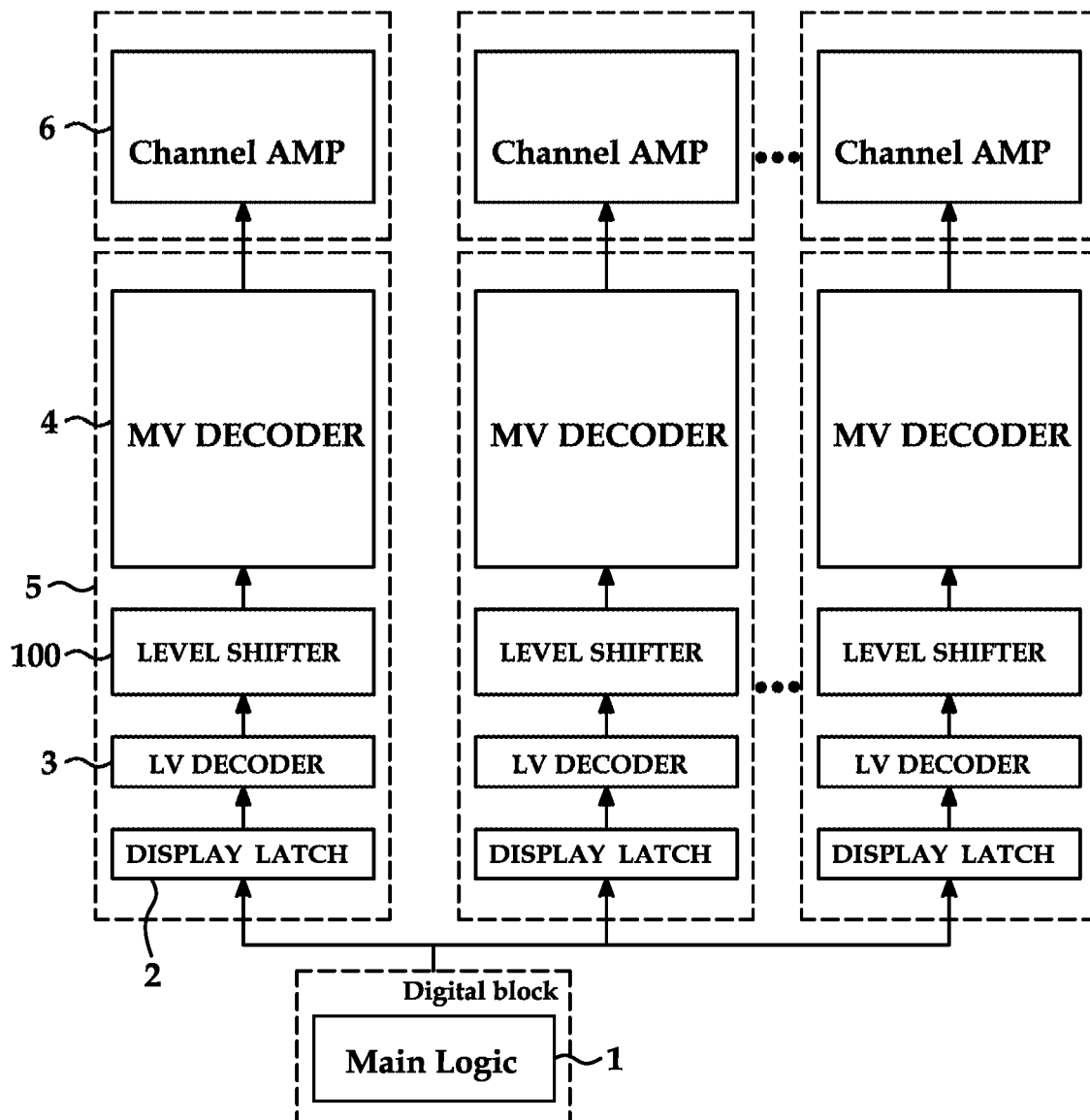
FIG. 1 is a system diagram showing an example of a display driver IC.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure.

The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Herein, it is noted that use of the term "may" with respect to an example or embodiment, e.g., as to what an example or embodiment may include or implement, means that at least one example or embodiment exists where such a feature is included or implemented while all examples and embodiments are not limited thereto.

The following description is to provide a mask layout for reducing a current flow toward a source when EOS occurs and a method of manufacturing a semiconductor device using the same.

The following description provides a mask layout having a silicide blocking region which is resistant to EOS and a method of manufacturing a semiconductor device using the same.

The following description also provides a mask layout having a silicide blocking region which disperse EOS current appropriately by adjusting gate-source, gate-drain, gate-bulk resistance, and a method of manufacturing a semiconductor device using the same.

FIG. 1 is an example of a system diagram showing a Display Driver IC according to the following description.

A Display Driver IC (hereinafter referred to as DDI) is an integrated circuit chip that is used for driving a display panel and electrically provides a display panel with driving signals and data.

The DDI includes a main logic block 1, a display driver block 5, and a channel block 6.

The main logic block 1 controls the operation of the display driver block 5 and the channel block 6.

The display driver block 5 decodes the data input according to the control of the main logic block and transfers the data input to the channel block. The display driver 5 includes a latch block 2, a first decoder 3, a level shifter block 100, and a second decoder 4. The latch block 2 latches the drive signal and data received from the main logic block 1. The first decoder 3 decodes a low voltage signal and the second decoder 4 decodes a medium voltage signal or a high voltage signal. The level shifter block 100 is connected between the first decoder 3 and the second decoder 4 to change the voltage level of the signal from a low voltage to a medium voltage or a high voltage.

The channel block 6 includes a plurality of channels respectively connected to the display panel, and outputs the decoded data signal through each channel according to the control signal of the display driver block 5. The display panel displays the data input through each channel.

Figure 2:
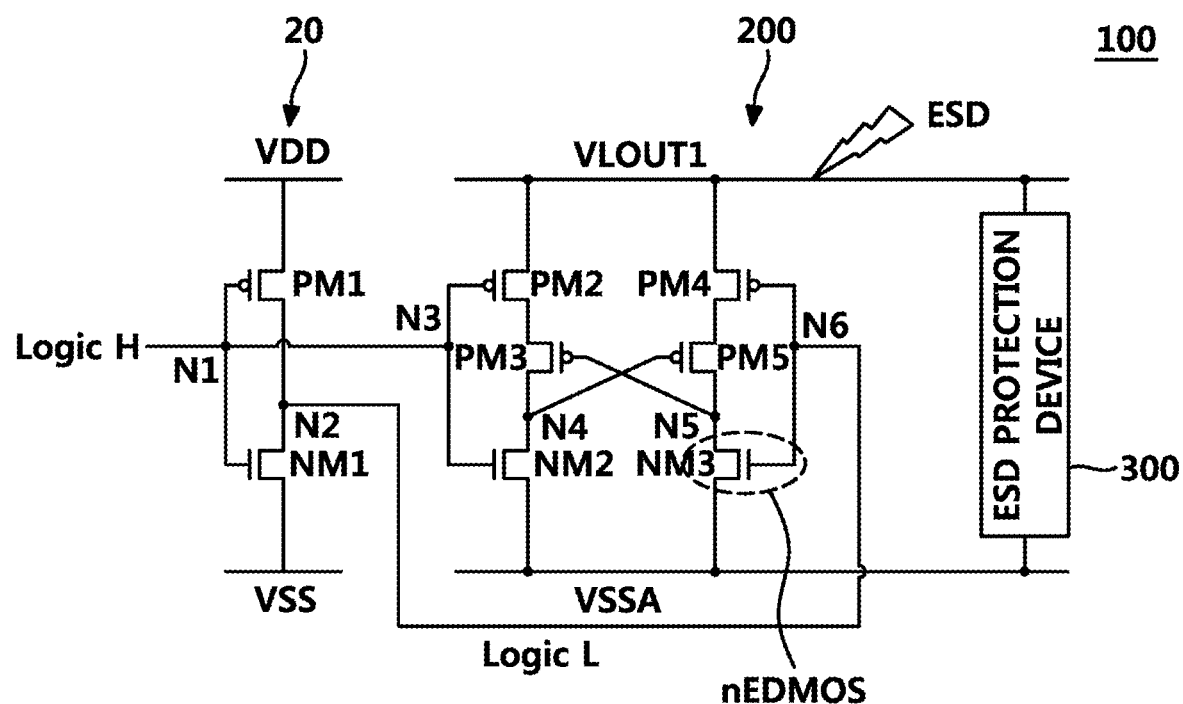
FIG. 2 illustrates an example of a level shifter block of a display driver IC.

FIG. 2 illustrates an example of a level shifter block of a display driver IC according to the following description.

Referring to FIG. 2, the level shifter block 100 includes an input interface block 20, an output interface block 200, and an ESD protection block 300.

The input interface block 20 may receive a first decoded signal from the first decoder. The input interface block 20 includes a first NMOS NM1 and a first PMOS PM1. The first NMOS NM1 has one end connected to the system ground voltage VSS and the other end connected to the first PMOS PM1. The first PMOS PM1 has one end connected to the power supply voltage VDD and the other end connected to the first NMOS NM1. A Logic High signal may be applied to the gates of the first NMOS NM1 and the first PMOS PM1, and a Logic Low signal may be output from the first NMOS NM1 and the first PMOS PM1.

The output interface block 200 includes a second NMOS NM2, a second PMOS PM2, a third PMOS PM3, a third NMOS NM3, a fourth PMOS PM4, a fifth PMOS PM5. The second NMOS NM2, the second PMOS PM2, and the third PMOS PM3 are connected in series between the output power supply voltage VLOUT1 and the output ground voltage VSSA. The third NMOS NM3, the fourth PMOS PM4, and the fifth PMOS PM5 are also connected in series between the output power supply voltage VLOUT1 and the output ground voltage VSSA.

The output interface block 200 receives the output terminal of the input interface block 10 as an input terminal, and the input terminal (logic high signal, logic low signal) is connected to each gate of the second NMOS NM2 and the second PMOS PM2, the third NMOS NM3 and the fourth PMOS PM4. Here, the second NMOS NM2 and the second PMOS PM2 may receive a logic high signal, and the third NMOS NM3 and the fourth PMOS PM4 may receive a logic low signal. One end of the main current path of the second NMOS NM2 and the third NMOS NM3 is commonly connected to the ground terminal, and the other end of the main current path is connected to each gate of the fifth PMOS PM5 and the third PMOS PM3. In an example, the second NMOS NM2 and the third NMOS NM3 are nEDMOS devices.

ESD protection block 300 may be disposed close to the chip core block in the level shifter block 100 and may be a circuit for ESD stress protection. The ESD protection block 300 is an ESD clamp of various types that may discharge high ESD current between an input voltage and a ground voltage to a low voltage at the time of ESD stress input. For example, a clamp element may have a gate grounded NMOS (GGNMOS) structure or a gate coupled NMOS (GCNMOS) structure or a structure constituting PNPN path after turn-on of Silicon Controlled Rectifier (SCR), or as another example, a rail-based clamping circuit in the form of an RC triggered big FET may be used.

In this case, when the second NMOS NM2 and the third NMOS NM3 are implemented as a transistor having a high voltage device structure, the design area of the level shifter block 100 may increase and the size of the DDI chip may increase as well. Accordingly, the second NMOS NM2 and the third NMOS NM3 may be implemented as nLDMOS or nEDMOS transistors to minimize the area occupied by the transistors in the level shifter block 100.

At this time, if Electrical Overstress (EOS) or Electro Static Discharge (ESD) occurs during the operation of the second NMOS NM2 and the third NMOS NM3, the level shifter block 100 may malfunction or be damaged.

CDM may cause EOS in the level shift block. For example, EOS occurs in the silicide region of the nEDMOS device illustrated in FIG. 2, where EOS is introduced into the source region, which is located closer to the gate electrode, and failures are caused. The silicide region may be a region for lowering the resistance to help the current flow because the silicide region is disposed on most part of the source region that the gate-source resistance becomes lower than the gate-drain resistance.

Therefore, the design of a silicide blocking region may be desired to reduce the current toward the source region when EOS occurs.

FIG. 3A is a mask layout for forming an example of a semiconductor device according to the following description.

Referring to FIG. 3A, a designed mask layout 400 may be provided. The mask layout 400 may include patterns to be printed in an integrated circuit on a wafer. For example, the IC design layout includes a pattern that defines various active regions to be formed on a semiconductor wafer. The mask layout 400 may include data in an appropriate format, such as graphic data system (e.g., GDS or GDS II). For example, GDS may be a data graphic system and may have a database file format. GDS may have a binary file format representing planar geometric shapes and/or other information about the layout in hierarchical form. The GDS data may be used to reconstruct parts of layouts of photo masks.

The mask layout for forming a semiconductor device includes an ACTIVE mask pattern 61-1, 61-2, a gate electrode mask pattern GE, and a silicide blocking region Z1. The mask layout, according to the example, is an overlapping result of the respective mask patterns for forming the semiconductor devices 1000, 2000, 3000, 4000, 5000. For example, N-type ACTIVE mask pattern NA, 61-1 and 61-2 for N-type active region and P-type ACTIVE mask pattern PA for forming an P-type active region, WELL masks NW and PW for forming N-well and P-well regions, a gate electrode mask pattern GE for forming a gate electrode, a silicide blocking mask Z1 for forming a silicide blocking film, contact masks 71, 72, 73, and 74 for forming contact plugs. The mask layout shows these plural masks being overlapped in one drawing.

The active mask pattern 61-1, 61-2, in one example, includes a drain region 22, a source region 23, and a bulk region 24. The source region 23 includes a heavily doped source region 23 and a lightly doped region LDD, 23-1. The heavily doped source region 23 and the lightly doped region LDD, 23-1 all have the same conductive type. The drain region 22, the source region 23, and the bulk region 24 includes at least one drain contact 72, at least one gate contact 73 and at least one bulk contact 74, respectively. The first active mask pattern 61-1 and the second active mask pattern 61-2 may be viewed to be spaced apart but are one active region in a cross-sectional view. The source region 23 and the bulk contact region 24 are formed in the first active mask pattern 61-1 and the drain region 22 is formed in the second active mask pattern 61-2.

The silicide blocking mask pattern ("silicide blocking region") Z1 is a region in which a silicide blocking film is formed. The remaining region excluding the silicide blocking mask pattern Z1 is a region in which the silicide blocking film is completely removed, and a silicide layer or a silicide film is formed (a silicide region).

In the following description, the silicide blocking region Z1 may be referred to as a region having a silicide blocking film or a silicide blocking layout or a silicide blocking region. The gate electrode mask pattern GE is a region in which the gate electrode is formed, and these terms will be described in the following description.

The silicide blocking region Z1 may be entirely or partially disposed on the top surface of at least one of the source region 23, the gate electrode mask pattern GE, and the drain region 22. As illustrated in FIG. 3A, the area where the silicide blocking film is disposed on the gate electrode is larger than the area where the silicide layer is disposed. By covering the majority of the gate electrode with the silicide blocking film, a resistance to EOS may be secured.

Assuming that there is no silicide blocking layout as illustrated in FIG. 3A, EOS failures are easily observed in the n-type EDMOS (hereinafter referred to as nEDMOS) used in the level shifter of FIG. 2. The level shifter block refers to a block that changes low voltage LV (1.8V) to a level such as medium voltage (MV) or high voltage (HV).

A failure region may occur at the gate electrode and the boundary of the active region, for example. The failure may be due to migration of a metal-silicide existing in the gate electrode upon EOS flow. However, when the silicide blocking region Z1 is disposed as illustrated in FIG. 3A, even if migration of metal-silicide occurs, the silicide region SAL2 on the source region and the silicide region SAL3 on the gate electrode may not be in contact with each other since the silicide blocking region Z1 exists in the source region 23.

If the external ESD stress level is increased excessively, EOS related failures may occur in the middle voltage level shifter in the channel decoder. Therefore, the external stress may flow into the IC, causing a failure of the operation of the Core Block of IC. In such a case, a line dim failure may occur. However, when a silicide blocking layout is formed as illustrated in FIG. 3A, the occurrence of failures in the Chip Core Block may be prevented. The Level Shifter is expected to function more stably.

Referring to FIG. 3A, the silicide blocking region Z1 is formed so as to overlap the gate electrode mask pattern GE, the source region 23, and the drain region 22 excluding the gate silicide region SAL3. The silicide blocking region Z1 is formed in a shape of 'C' which surrounds three sides of the gate silicide region SAL3 and is opened at one side. The silicide blocking region Z1 is formed so as to overlap a substantial part of the gate electrode mask pattern GE, and formed to surround three sides of the gate silicide region SAL3. A silicide blocking region Z1 is formed on the opposite sides of the gate contact 73, and it is to be formed to be spaced apart from the gate contact 73 by a certain distance.

Since the silicide blocking region Z1 is formed, including a part of the source region 23, the resistance between the gate contact 73 and the source contact 71 is increased. In other words, the resistance of the nEDMOS semiconductor device 1000 is increased as a whole because of the presence of the silicide blocking region Z1 on the gate electrode and the source region. Therefore, the voltage applied between the gate electrode and the source region of the nEDMOS semiconductor device 1000 may be reduced, in an ESD stress environment. Thus, the unique operation of the nEDMOS semiconductor device 1000 may be performed more securely in the ESD stress environment.

As illustrated in FIG. 3A, a silicide blocking film is formed on the upper part of the gate electrode, and a silicide blocking film is formed so as to extend beyond the boundary between the gate electrode and the active mask pattern 61. Thus, the silicide migration path may be blocked. In addition, misalignment that may occur between the gate electrode mask pattern GE and the silicide blocking region Z1 may be prevented. The silicide blocking region Z1 is designed so as to extend wider than the area of the gate electrode mask pattern GE.

The silicide blocking region Z1 is formed to include a part of the source region 23 and is formed to be spaced apart from the source contact 71 on the source region 23 by a certain distance. That is, since the silicide blocking region Z1 is disposed between the source region 23 and the gate electrode mask pattern GE to prevent the breakdown due to overcurrent stress.

The contact mask patterns 71, 72, 73, and 74, illustrated in FIG. 3A, include a plurality of gate contacts 73, a plurality of source contacts 71, a plurality of drain contacts 72 and a plurality of bulk contacts 74. That is, a contact plug is formed by the silicide blocking mask patterns 71, 72, 73, and 74 to be connected to a metal wiring.

In the mask pattern illustrated in FIG. 3A, the silicide region includes a gate silicide region SAL3, a source silicide region SAL2, a drain silicide region SAL1, and a bulk silicide region SAL4. The gate silicide region SAL3 is formed in a certain region where a plurality of gate contacts 73 are located and around the plurality of gate contacts 73. The source silicide region SAL2 is formed in a certain region in which a plurality of source contacts 71 are located and around the source contacts 71. The drain silicide region SAL1 is formed in a certain region where a plurality of drain contacts 72 are located and around the drain contacts 72. The bulk silicide region SAL4 is formed in a certain region where the plurality of bulk contacts 74 are located and around bulk contacts 74.

In order to describe the silicide blocking region Z1 in detail, the silicide blocking region Z1 will be described in parts in FIG. 3B.

Figure 3B:
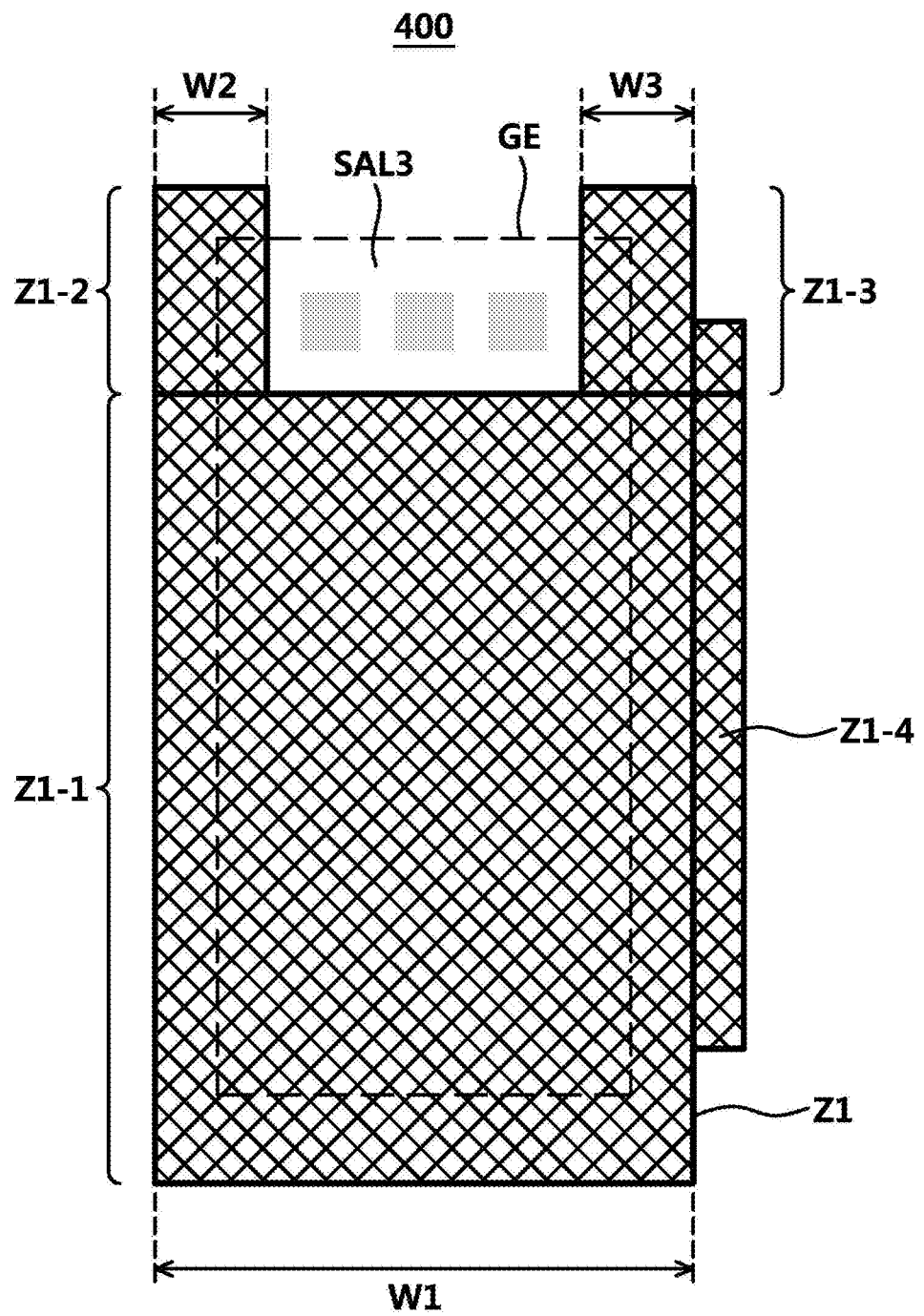

As illustrated in FIG. 3B, the silicide blocking region Z1 includes a main silicide blocking region or body region Z1-1, a first protruding silicide blocking region Z1-2, a second protruding silicide blocking region Z1-3, and an extended silicide blocking region Z1-4.

The main silicide blocking region Z1-1 overlaps with a portion of the source region, a portion of the drain region and a portion of the gate electrode 60. The main silicide blocking region Z1-1 may be referred to as a body region as illustrated in FIG. 3B.

Further, a first protruding silicide blocking region Z1-2 and a second protruding silicide blocking region Z1-3 are extended from the main silicide blocking region Z1-1. The width W2 of the first protruding region Z1-2 is less than the width W1 of the body region Z1-1. Similarly, the width W3 of the second protruding region Z1-3 is less than the width W1 of the body region Z1-1. Accordingly, a silicide blocking film is formed between the gate electrode and the source electrode, thereby preventing current from concentrating in the source region.

The first protruding silicide blocking region Z1-2 is extended from the gate electrode toward the source region 23. The first protruding silicide blocking region Z1-2 has a silicide blocking film to be formed between a part of the gate region and the source region. Thus, a silicide blocking film is formed between the gate electrode and the source electrode, thereby preventing current from being concentrated in the source region.

A second protruding silicide blocking region Z1-3 is extended from the gate electrode toward the drain region. The second protruding silicide blocking region Z1-3 prevents an excessive current concentration between the drain region and the gate electrode by forming a silicide blocking film. Each of width or area of the first protruding silicide blocking region Z1-2 is smaller than the main silicide blocking region Z1-1. Each of width or area of the second protruding silicide blocking region Z1-3 is also smaller than the main silicide blocking region Z1-1.

On the other side of the silicide blocking region Z1 further includes a third protruding silicide blocking region Z1-4 extending further to the drain region. The third protruding silicide blocking region Z1-4 is formed in contact with the second protruding silicide blocking region Z1-3. The third protruding silicide blocking region may maximize the effect of preventing excessive concentration of current in the drain region by forming silicide blocking that is further extended to the drain region.

Figure 4:
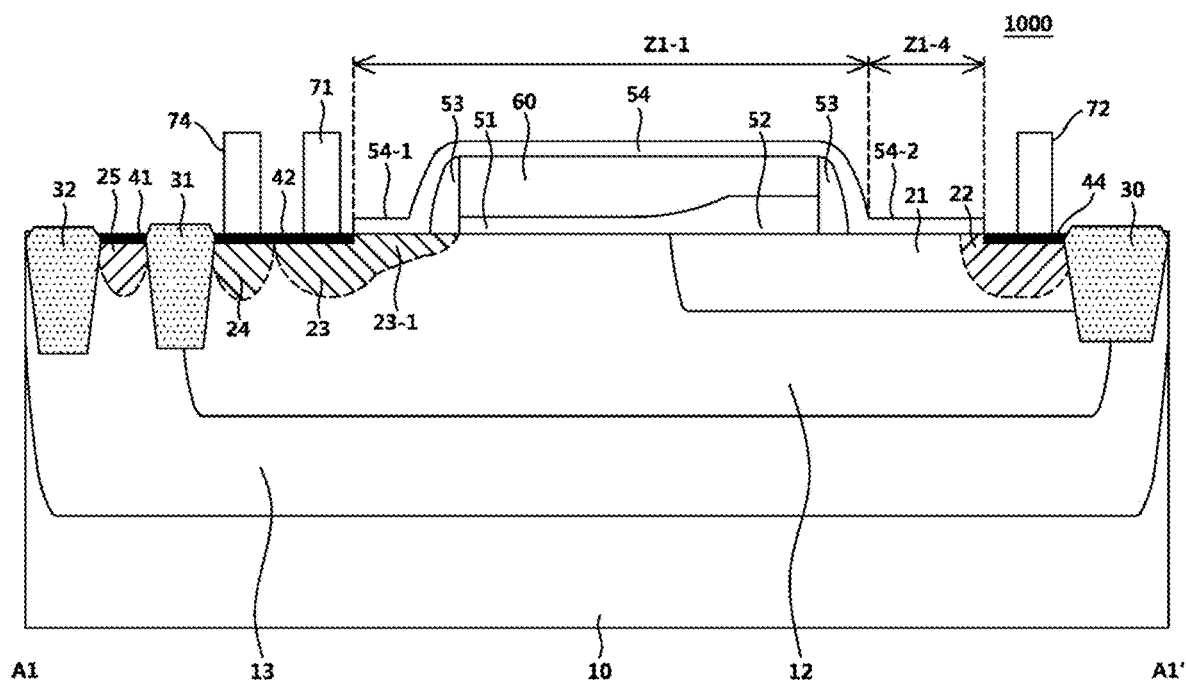
FIG. 4 is a cross-sectional view of an example of a semiconductor device, with respect to A1-A1' of FIG. 3A.

FIG. 4 is a cross-sectional view of an example of a semiconductor device 1000 according to the following description, taken along the line A1-A1' of FIG. 3A.

Referring to FIG. 4, a semiconductor device 1000 includes the first conductive type well region 12 formed in a substrate 10. The well region 12 is disposed between isolation regions 30 and 31 in an active region 61 and is formed deeper than the isolation regions 30 and 31. Gate insulating films 51 and 52, having different thicknesses, are formed on the well region 12. A gate electrode 60 is disposed on the gate insulating films 51 and 52. A drain region 22 and a source region 23 are formed in the well region 12. Spacers 53 are formed on the opposite sides of the gate electrode 60. Since the spacer 53 is also insulating film, it hinders silicide from forming. Therefore, the spacer 53 may also be a silicide blocking film. However, in the following description, a silicide blocking film 54 is a different film from the spacer 53.

The gate insulating films 51 and 52 may include a first gate insulating film 51 and a second gate insulating film 52 having different thicknesses. The first gate insulating film 51 is thinner than the second gate insulating film 52.

The first gate insulating film 51 is disposed close to the source region 23. The second gate insulating film 52 is disposed close to the drain region 22, which prevents the breakdown of the gate insulating film from the high voltage applied the drain region.

For example, when the drain voltage is greater than or equal to about 3.3 V as a middle voltage, and the gate voltage is about 0.5 V to 2 V as a low voltage, if only the thick gate insulating film is used, the drain current may become too low, thereby the area of the semiconductor device is increased in order to have a greater width of the channel region. Conversely, if only a thin gate insulating film is used, the gate insulating film may be destroyed due to a drain voltage which is higher than the middle voltage. Accordingly, the following description provides a gate insulating film that includes a thin gate insulating film and a thick gate insulating film.

Since the drain voltage is higher than the source voltage, the gate insulating film according to another example may be formed to be inclined so as the thickness of the insulating film to be thinner in the source region than in the drain region. The drain region 22 is formed to be spaced apart by a certain distance from the gate electrode 60 in order to increase the breakdown voltage. The source region 23 is formed by overlapping a part of the gate electrode 60 and the spacer insulating film 53.

The semiconductor device 1000 further includes an extended drain junction region 21.

The extended drain junction region 21 is disposed to extend from the drain region 22 to the thin gate insulating film 51 and provides a high drain current. The extended drain junction region 21 is formed so as to surround the drain region 22 because ion implantation is performed at energy higher than the drain region 22. The extended drain junction region 21 may be formed using N-type impurity (Phosphorous) or arsenic. The depth of the extended drain junction region 21 is set to be less than the depth of the isolation region 30 disposed next. The length of the extended drain junction region 21 is freely adjustable between the gate insulating films 51 and 52. The extended drain junction region 21 may be an N-type extended Drain Junction region (hereinafter referred to as NEXT).

An extended silicide blocking region Z1-4 is disposed between the gate electrode 60 and the drain region 22 in order to increase the gate-drain breakdown voltage. A main silicide blocking region Z1-1 is extended between the gate electrode 60 and the source region 23 in order to prevent EOS failures.

The main and extended silicide blocking regions Z1-1 and Z1-4 are to prevent the silicide layer from forming. That is, the region where the silicide blocking film 54 is formed.

The silicide blocking film 54 may be formed of a material such as LPCVD oxide film, an LPCVD nitride film (SiN), or the like. The silicide blocking film 54 may be formed to have a thickness of about 500 to 4000 Å. A silicide film may be formed excluding the main and extended silicide blocking regions Z1-1 and Z1-4. Here, both the silicide blocking film 54 and the spacer insulation film 53 serve as a silicide blocking film. However, since the silicide blocking film 54 is formed after the spacer insulating film 53 is formed, the silicide blocking film 54 is different from the spacer insulating film 53. In most cases, the silicide blocking film 54 may be formed on the substrate 10 and the gate electrode 60 as well as the spacer insulating film 53.

The semiconductor device 1000 may further include the second conductive type deep well region DNW, 13. The second conductive type deep well region 13 may be needed when the present semiconductor device 1000 and another device are to be isolated. The deep-well region 13 is disposed between the isolation regions 30 and 32, and it is disposed below the first conductive type well region 12. At this time, the second conductive type deep well contact region 25 for applying a bias voltage to the second conductive type deep well region 13 may be further formed. The second conductive type deep well region DNW, 13 is formed by ion implantation using N-type impurity, that is, Arsenic (As) or phosphor (P) with the energy of 20 to 100 KeV, and a doping concentration may be 1.5E10~1.5E16 atoms/cm$^2$.

The semiconductor device 1000 includes isolation regions 30, 31, and 32 to isolate adjacent device formed next to the drain region 22 and the bulk region 24.

The isolation region may be one of Short Trench Isolation (STI), Medium Trench Isolation (MTI), and Deep Trench Isolation (DTI). The isolation region may be LOCOS oxide film instead of a trench. The isolation regions 30, 31, and 32 are formed to have a depth of about 100 to 2000 Å when formed as STI. The isolation regions 30, 31 and 32 may be formed by filling with a silicon oxide film (SiO2), a silicon nitride film (SiN), or polysilicon (poly-Si) material, or a combination of the materials mentioned above.

The semiconductor device 1000 may include the first conductive type bulk region 24 between the isolation region 31 and the source region 23. The first conductive type bulk region 24 is for applying a bias voltage to the well region 12 of the first conductive type.

The silicide regions 41, 42 and 44 are disposed on the second conductive type deep well contact region 25, the first conductive type well contact region 24, the source region 23, and the drain region 22. The source contact 71 is formed on the source silicide region 42. The drain contact 72 is formed on the drain silicide region 44. A first conductive type bulk contact 74 is formed on the first conductive type bulk region 24. Here, the silicide regions 41, 42 and 44 are regions in which the silicide layer (or a silicide film) is formed.

The material of the silicide regions 41, 42, 43, and 44 consists of metal-silicide material, e.g., material such as titanium-silicide (TiSi$_2$), cobalt-silicide (CoSi$_2$), or nickel-silicide (NiSi). The silicide regions 41, 42 and 44 may be also referred to as a silicide layer (or a silicide film).

The EDMOS semiconductor device 1000 according to the example illustrated in FIG. 4 may be manufactured by the following method.

A second conductive type deep well region 13 may be formed on a first conductive type substrate 10. A first conductive type well region 12 may be formed on the second conductive type deep well region 13. An extended drain junction 21 may be formed on one side of the top surface of the first conductive type well region 12. At least two or more gate insulating films 51 and 52 having different thicknesses may be formed on the first conductive type well region 12. Conductive material for a gate electrode may be deposited on at least two or more gate insulating films 51 and 52 having different thicknesses. A mask pattern for a gate electrode may be formed on the conductive material for the gate electrode. A gate electrode 60 may be formed by etching the conductive material using the mask pattern for the gate electrode. Then, a spacer 53 may be formed on the side surface of the gate electrode 60. On the top surface of the first conductive type well region 12A, a source region 23 may be formed on one side of the gate electrode 60 and a drain region 22 may be formed on the other side of the gate electrode 60. Further, the first conductive type bulk region 24 may be formed on the top surface of the first conductive type well region 12. The drain region 22 and the bulk region 24 may be isolated from other devices by isolation regions 30 and 31. The second conductive type deep well contact region 25 may also be isolated from other devices by an isolation region 32.

A first insulating film (not illustrated) may be deposited on the entire surface of the substrate in order to form a silicide blocking film 54. The first insulating film for forming the silicide blocking film 54 may be formed of material such as LPCVD oxide film or an LPCVD nitride film (SiN) and the thickness of the first insulating film to form a first silicide blocking insulating film may be about 500 to 4000 Å. The first insulating film (silicide blocking insulating film) may be deposited so as to entirely cover the gate electrode, the source region, and the drain region. And the silicide blocking region pattern may be formed. A silicide blocking film may be formed by patterning or etching the first insulating film using a silicide blocking mask pattern. The gate electrode, a part of the source region, and a part of the drain region may be exposed by etching. The silicide blocking film may remain in the region Z1 covered by the silicide blocking mask pattern. Therefore, the region where the silicide blocking film remains may be the silicide blocking region. That is, a non-silicide region.

The semiconductor device 1000 may deposit metal such as Co, Ni, or Ti to form a silicide layer (or a film). A Self-aligned silicide (silicide, in short) process may be used in order to simultaneously form the silicide layer in the gate electrode and the source/drain/bulk regions. A silicide film may be formed in the exposed gate electrode, the bulk region, the source region, and the drain region by heat treatment. In the semiconductor device 1000, a silicide region may be formed on a part of the gate electrode, a part of the source region, a part of the drain region, the bulk region, the first conductive type well contact region, and the second conductive type well contact region during a high-temperature heat treatment process at a temperature of about 500-750° C. The silicide films 41, 42, and 44 may not be formed in the region where the silicide blocking film 54 remains. Also, the silicide film may not be formed on the spacer 53 or the isolation insulating films 30 to 34.

The silicide blocking film 54 may be formed up to a part of the drain region 22 including a part of the source region 23. Specifically, the silicide blocking film 54 may be spaced apart from the source contact 71 by a certain distance and formed from a section including the spacer insulating film 53 and a part of the source region 23 to a section including part of the drain region. That is, the silicide blocking region Z1 may be formed in the region Z1 excluding the region where the silicide may be formed, which corresponds to the width of the region Z1 of FIG. 3.

Since the silicide blocking region Z1 may be spaced apart from the source contact 71 by a certain distance, the silicide blocking region Z1 may be modified according to a demand of a designer. That is, the silicide blocking region Z1 may be formed by optimizing the separation distance from the source contact 71. Thereby, the overcurrent between the gate electrode 60 and the source region 23 may be prevented.

In other words, the resistance may increase as a whole due to the presence of the silicide blocking region Z1 on the gate electrode and the source region in the semiconductor device 1000. Therefore, in the ESD stress environment, the voltage applied between the gate electrode and the source region of the semiconductor device 1000 may be reduced. Thus, the unique operation of the semiconductor device 1000 may be performed more securely in the ESD stress environment. The separation distance between the silicide blocking region and the source contact 71 may be greater depending on users.

In conclusion, the semiconductor device 1000 according to the example includes a source region and a drain region formed on a substrate; a gate insulating film and a gate electrode formed between the source region and the drain region; a spacer formed on the sidewall of the gate electrode; a silicide blocking film formed on a part of the source region, the gate electrode and the drain region, respectively; and a silicide layer formed in the remaining regions of the source region, the gate electrode, and the drain region, respectively.

The silicide blocking film may be formed from a part of the top surface of the gate electrode and extends to a part of the top surface of the drain region. Moreover, the source region may be in contact with the silicide layer and the silicide blocking film at the same time. The length of the silicide layer in the source region may be greater than the length of the silicide blocking film.

The silicide blocking film may be formed starting from on a gate electrode and extends to a spacer and a source region. The source region 23 has the silicide layer and the silicide blocking film at the same time. The silicide blocking film 54 may be present on the spacer insulating film 53. The silicide blocking film 54-1 may be also present in a part of the source region 23. Thus, the source region 23 may be in contact with the spacer insulating film 53 and the silicide blocking films 54 and 54-1 at the same time. The silicide blocking film 54-1 may be formed extending from the gate electrode 60 to the source region covering the spacer insulating film 53.

Due to the presence of the silicide blocking region Z1 on the gate electrode and the source region in the semiconductor device 1000, an overall resistance may be increased. Therefore, in the ESD stress environment, the voltage applied between the gate electrode and the source region of the semiconductor device 1000 may be reduced. Thus, the unique operation of the semiconductor device 1000 may be performed more securely in the ESD stress environment.

Although not illustrated in the figure, the semiconductor device 1000 may further include an interlayer insulating film on the gate electrode and the silicide blocking insulating film. The interlayer insulating film may include first, second, and third interlayer insulating films.

The first interlayer insulating film may include a silicon oxide nitride film (SiON) or a silicon nitride film (SiN) for borderless contact. The second interlayer insulating film may be deposited on the first interlayer insulating film. The second interlayer insulating film may include PSG or BPSG film. The third interlayer insulating film may be deposited on the second interlayer insulating film. The third interlayer insulating film may include an oxide film (PECVD SiO2). A contact etching process for forming a contact plug may be performed. The contact plug may be formed on the source region, the drain region, and the gate region by etching the first, second, and third interlayer insulating films. Thus, a source contact 71, a drain contact 72 and a gate contact 73 are formed on the source region, the drain region, and the gate region, respectively. The first conductive type bulk contact 74 may be formed on the first conductive type bulk region 24. The gate contact, the source contact, the drain contact, and the bulk contact are formed on the top surface of the silicide region.

Figure 5:
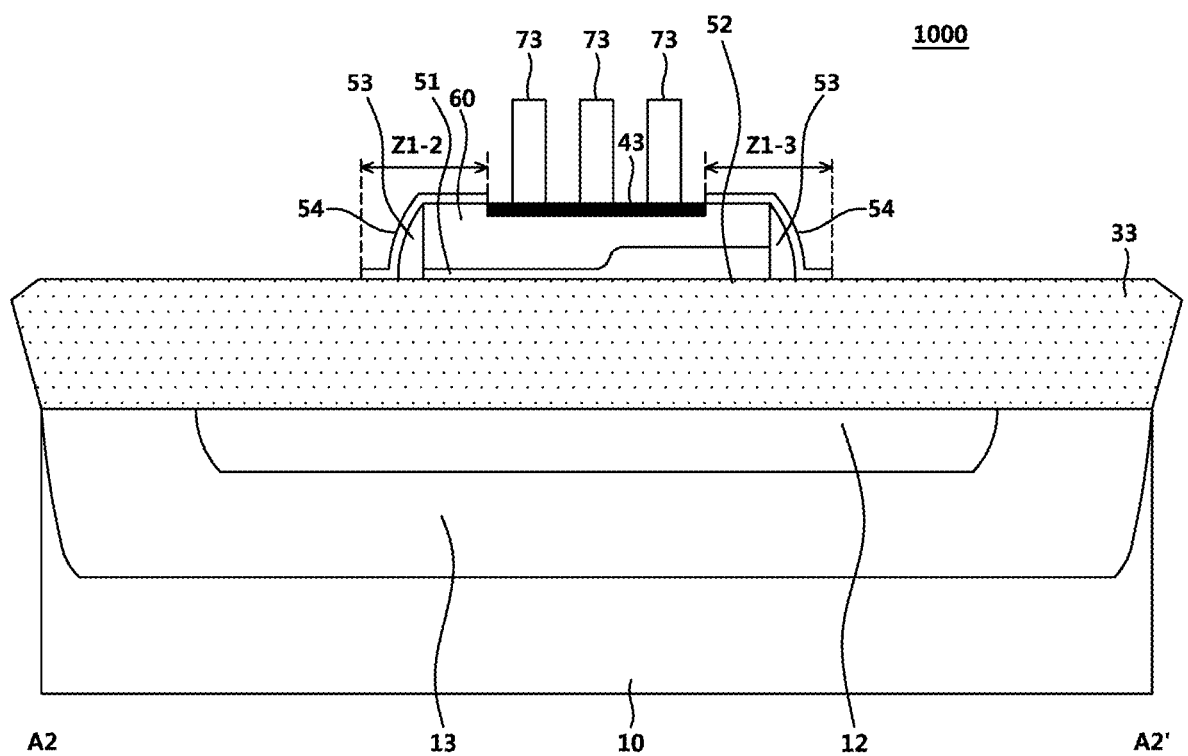
FIG. 5 is a cross-sectional view of an example of a semiconductor device, with respect to A2-A2' of FIG. 3A.
Figure 6:
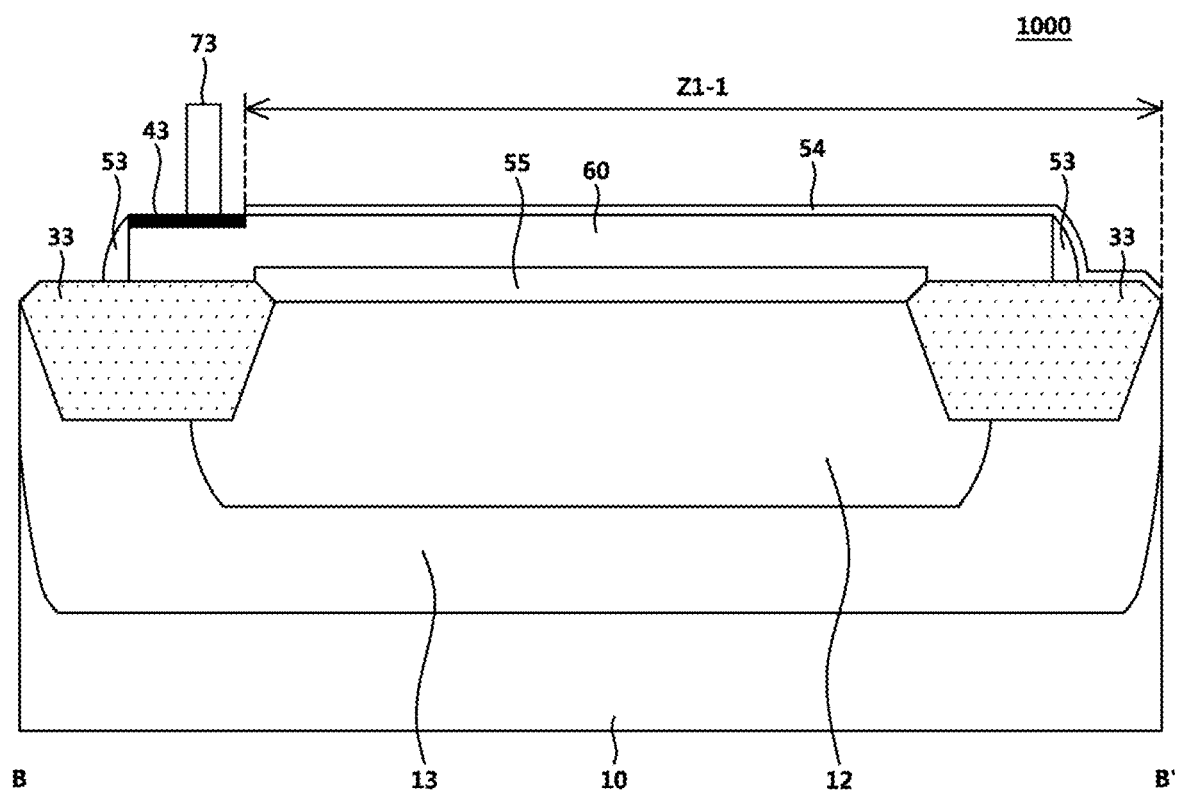
FIG. 6 is a cross-sectional view of an example of a semiconductor device, with respect to B-B' of FIG. 3A.

FIG. 5 is a cross-sectional view taken along the line A2-A2' of the semiconductor of FIG. 3A, and FIG. 6 is a cross-sectional view taken along the line B-B' of the semiconductor device of FIG. 3A.

Referring to FIG. 5, the isolation region 33 may be formed on the first conductive type well region 12 in which the source region and the drain region are formed. Gate insulating films 51 and 52 having different thicknesses may be formed on the isolation region 33 and the gate electrode 60 may be formed on the gate insulating films 51 and 52 having different thicknesses.

The gate silicide regions 43 and SAL3 may be formed on a certain region of the gate electrode 60 where the gate contacts 73 are disposed. A first protruding silicide blocking region Z1-2 and a second protruding silicide blocking region Z1-3 may be formed on opposite sides of the gate electrode 60, respectively. As a result, the silicide blocking regions Z1-2 and Z1-3 may be formed in the remaining region of the gate electrode 60 excluding the gate silicide region 43. That is, the first and second protruding silicide blocking regions Z1-2 and Z1-3 may be formed spaced apart from the gate contact 73 by a certain distance. The first and second protruding silicide blocking regions Z1-2 and Z1-3 may be formed on a part of the top surface of the gate electrode and the spacer insulating film 53. Here, the silicide blocking regions Z1-2 and Z1-3 may be spaced apart from the gate contact 73 by a certain distance, and the separation distance may be minimized.

A silicide blocking film 54 may be deposited on the silicide blocking regions Z1-2 and Z1-3, in order to prevent the formation of a silicide region. The silicide blocking film 54 may be formed of a material such as LPCVD film, silicon nitride film (SiN), or the like, and may have a thickness of about 500 to 4000 Å. The silicide blocking film 54 may also be formed on the spacer insulating film 53.

As illustrated in FIG. 6, taken along the line B-B', the semiconductor device 1000 which is isolated by an isolation region 33 may include a main silicide blocking region Z1-1 in the remaining region of the gate electrode 60 excluding the gate silicide regions 43 and SAL3. A first conductive well region 12 may be disposed between the isolation regions 33, and a gate insulating film 55 may be formed on the well region 12. The gate insulating film 55 may include a first insulating film 51 or a second insulating film 52. A gate electrode 60 may be formed on the gate insulating film 55. Spacers 53 may be formed on sidewalls of the gate electrode 60. The gate electrode 60 may be formed on the first conductive type well region 12 and disposed to overlap a part of the top surface of the isolation region 33.

In the main silicide blocking region Z1-1, a silicide blocking film 54 may be deposited to prevent the formation of a silicide region. The silicide blocking film 54 may be formed of a material such as LPCVD oxide film, LPCVD nitride film (SiN), or the like, and may have a thickness of about 500 to 4000 Å. The main silicide blocking region Z1-1 may be formed on a part of the top surface of the gate electrode spaced apart from the gate contact 73 by a certain distance. That is, the silicide blocking film 54 may be formed on the remaining region of the gate electrode 60 excluding the gate silicide 43 in which the gate contact 73 is formed. The silicide blocking film 54 may be also formed on the spacer insulating film 53.

Figure 7:
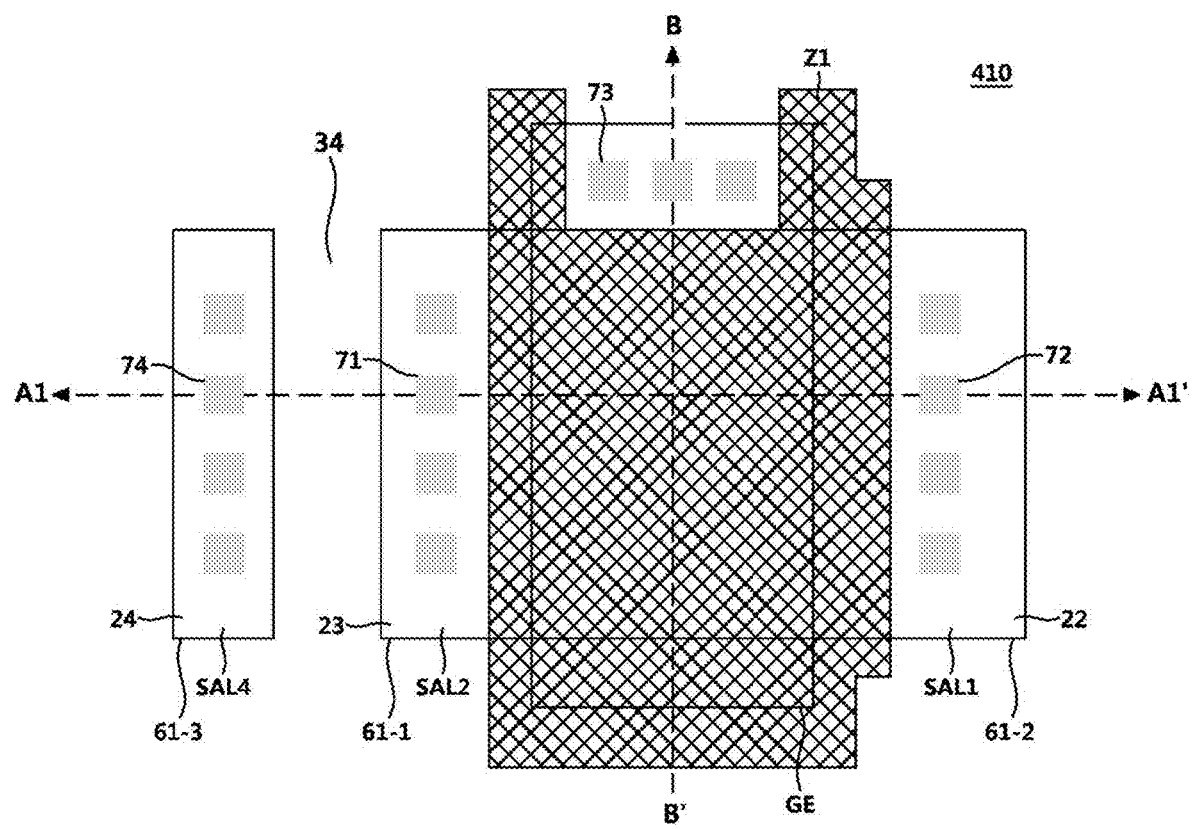
FIG. 7 is a mask layout for forming another example of a semiconductor device.

FIG. 7 is a mask layout for forming another example of a semiconductor device. FIG. 7 is an example different from FIG. 3A, and for the convenience of explanation, the difference from FIG. 3A is mainly described.

Referring to FIG. 7, the source region 23 and the bulk region 24 may not be in contact with each other, but may be disposed to be spaced apart by a certain distance.

More specifically, a mask pattern 410 for forming an EDMOS semiconductor device may include a gate electrode mask pattern GE, a silicide blocking region Z1, a first active mask pattern 61-1, a second active mask pattern 61-2 and a third active mask pattern 61-3. The first active mask pattern 61-1 and the third active mask pattern 61-3 may be disposed apart from each other. A source region 23 may be formed in the first active mask pattern 61-1, a drain region 22 may be formed in the second active mask pattern 61-2, and a bulk region 24 may be formed in the third active mask pattern 61-3. An isolation region 34 may be disposed between the first active mask pattern 61-1 and the third active mask pattern 61-3.

Figure 8:
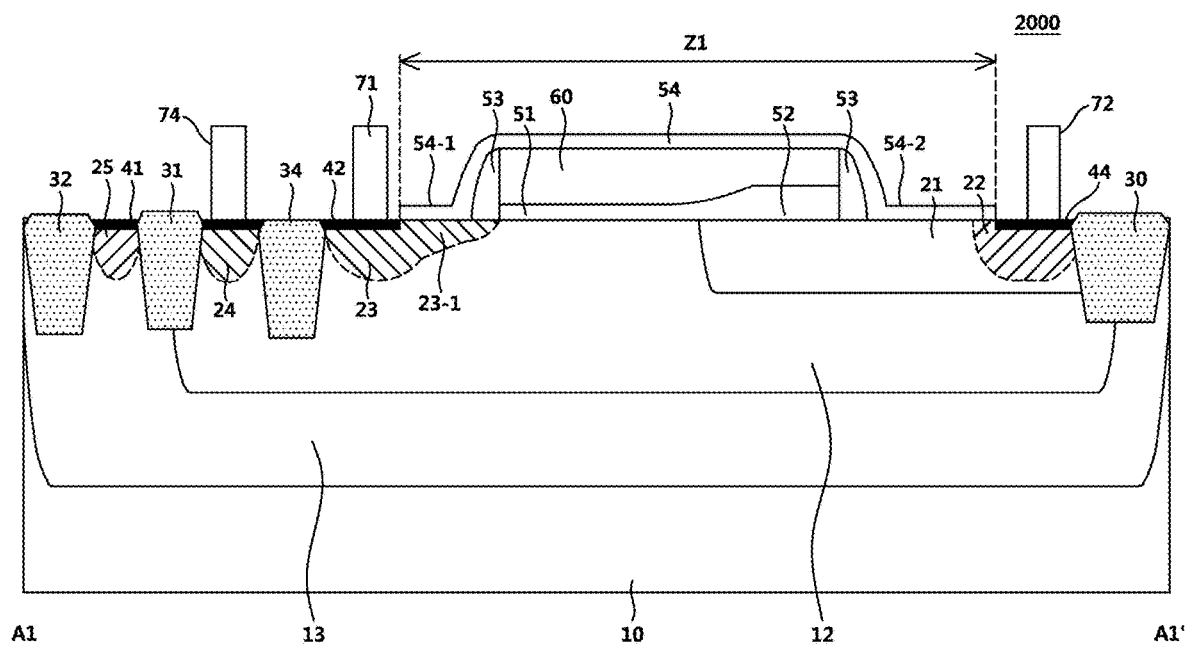
FIG. 8 is a cross-sectional view of an example of a semiconductor device, with respect to A1-A1' of FIG. 7.

FIG. 8 is a cross-sectional view of an example of a semiconductor device according to the following description, taken along the line A1-A1' of FIG. 7. For the convenience of explanation, differences from FIG. 4 will be mainly described.

In the semiconductor device 2000 according to the example, the source region 23 and the bulk region 24 are not in contact with each other and may be disposed spaced apart by the isolation region 34 constituted by STI, MTI, or the like. The reason for isolating the source region 23 and the bulk region 24 may be to apply different voltages, respectively. For example, a ground voltage may be applied to the source region 23 and a voltage higher than the ground voltage may be applied to the bulk region 24.

Figure 9:
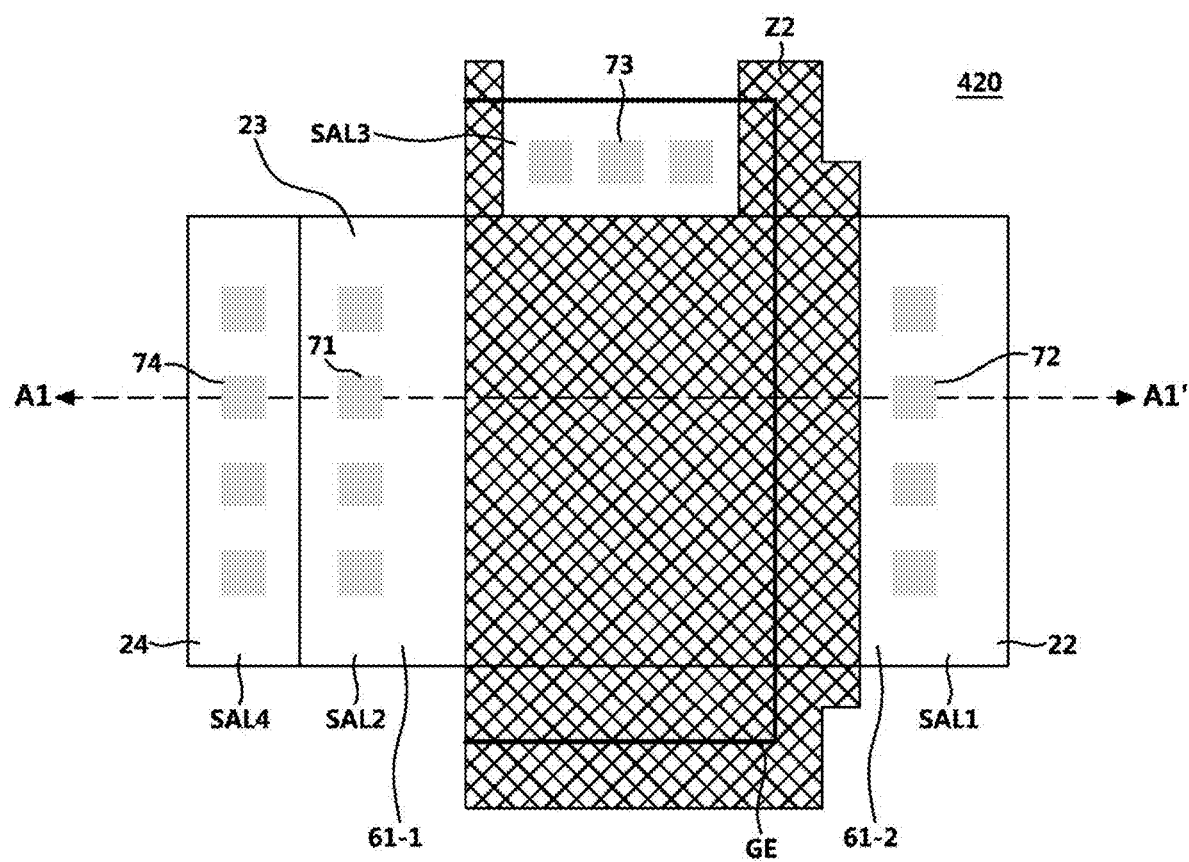
FIG. 9 is a mask layout for forming another example of a semiconductor device.

FIG. 9 is a mask layout for forming another example of a semiconductor device.

Referring to FIG. 9, the silicide blocking region Z2 in a mask pattern 420 may be formed by aligning with the edge of the gate electrode mask pattern GE. The edge of the gate electrode mask pattern GE may depict the boundary line between the source region 23 and the gate electrode mask pattern GE. The silicide blocking region Z2 may be just as described in FIG. 3. For the convenience of description, differences from FIG. 3 will be mainly described.

The silicide blocking region Z2 according to another example may be formed covering a part of the drain region 22 and the top surface of the gate electrode mask pattern GE excluding the gate silicide region SAL3. Unlike the silicide blocking region Z1 illustrated in FIG. 5, the entire silicide blocking region Z2 is not formed on the source region. Therefore, the distance between the source region and the gate electrode region may be reduced; thus the device size in the chip may be reduced.

The entire silicide blocking region Z2 may surround the gate silicide region SAL3.

That is, the silicide blocking region Z2 may be disposed spaced apart from the gate contacts 73 by a certain distance. Thereby, the resistance between the gate contacts 73 and the source contacts 71 may increase. In other words, the resistance may increase as a whole due to the presence of the silicide blocking region Z2 on the gate electrode and the source region of the EDMOS semiconductor device 3000. Therefore, the voltage applied between the gate electrode and the source region of the EDMOS semiconductor device 3000 in ESD stress environment may be reduced. Thus, the unique operation of the EDMOS semiconductor device 3000 may be performed more securely in the ESD stress environment.

The silicide blocking region Z2 may be formed starting from on the top surface of the gate electrode mask pattern GE excluding the gate silicide region SAL3 to a part of the top surface of the drain region. As illustrated, the entire remaining top surface of the gate electrode mask pattern GE excluding the gate silicide region SAL3 may be covered by the silicide blocking region Z2.

As illustrated, if an area of the silicide blocking film 54 becomes smaller, the size of the IC may be reduced.

The silicide region may be formed in a region that does not overlap the entire silicide blocking region Z2 as illustrated in FIG. 9. The silicide region includes a gate silicide region SAL3, a drain silicide region SAL1, a source silicide region SAL2, and a bulk silicide region SAL4.

Figure 10:
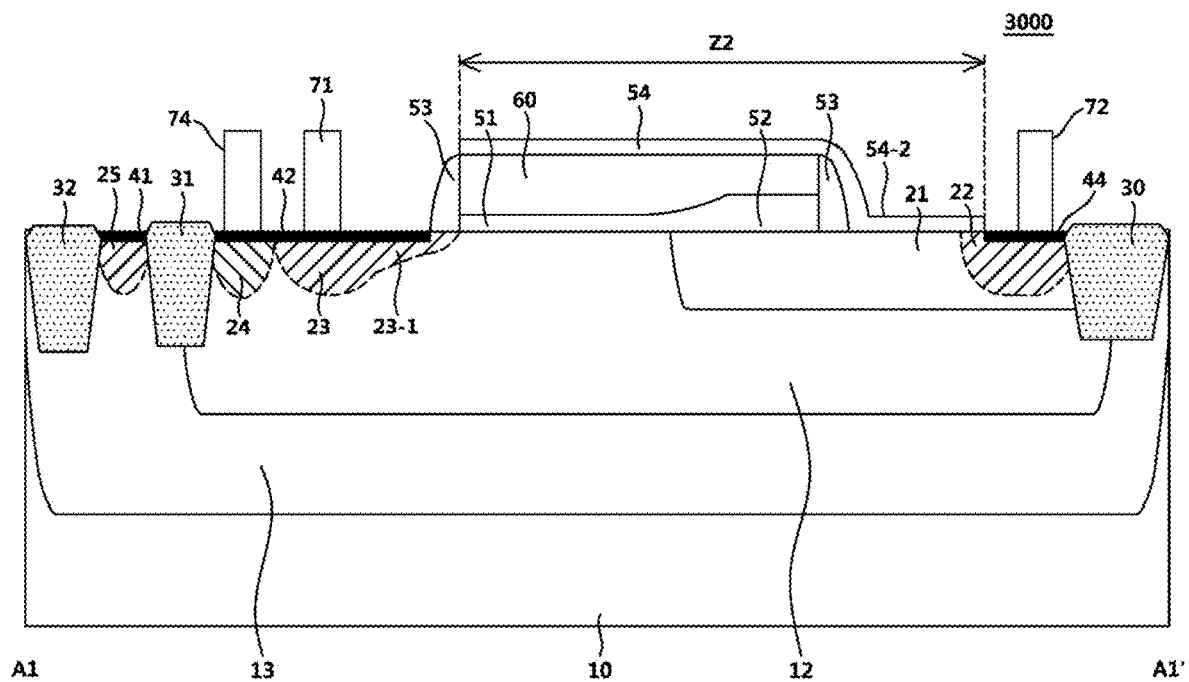
FIG. 10 is a cross-sectional view of an example of a semiconductor device, with respect to A1-A1' of FIG. 9.

FIG. 10 is a cross-sectional view of a semiconductor device according to the following description, taken along the line A1-A1' of FIG. 9. For the convenience of explanation, differences from FIG. 4 will be mainly described.

The left end of the silicide blocking film 54 may be formed to meet the left end of the gate electrode. Thus, only the silicide layer is formed in the entire source region 23. A silicide blocking film is not formed. The resistance between the gate electrode and the source region may be reduced compared to the structure illustrated in FIG. 4.

Figure 11:
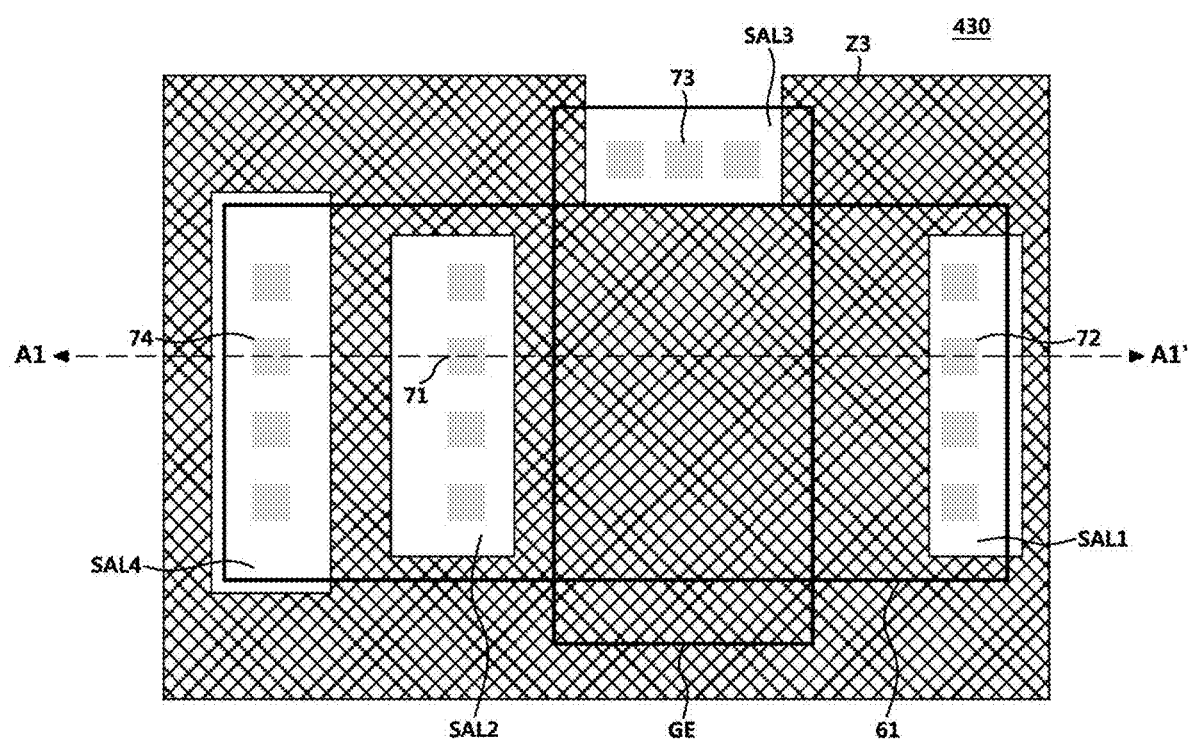
FIG. 11 is a mask layout for forming another example of a semiconductor device.

FIG. 11 is a mask layout for forming another example of an EDMOS semiconductor device. For the convenience of description, differences from FIGS. 3 and 4 will be mainly described.

Referring to FIG. 11, the silicide blocking region Z3 in a mask pattern 430 may be formed so as to surround the gate silicide region SAL3, the drain silicide region SAL1, the source silicide region SAL2, and the bulk silicide region SAL4. The silicide blocking region Z3 in the mask pattern 430 may be disposed over the entire semiconductor device so as not to overlap the respective silicide regions.

As illustrated in FIG. 11, the silicide blocking region Z3 may be disposed so as to surround only three sides of the gate silicide region SAL3, but surround all sides of the bulk silicide region, the source silicide region, and the drain silicide region. That is, the entire silicide blocking region Z3 is formed in all regions excluding the gate silicide region SAL3, the drain silicide region SAL1, the source silicide region SAL2, and the bulk silicide region SAL4. In this case, the silicide blocking film 54 may be formed in all regions excluding the silicide regions 41, 42, 43, 44, and 45.

The resistance between the gate contact 73 and the source contact 71 may be increased due to the entire silicide blocking region Z3. The voltage applied between the gate electrode and the source region of the semiconductor device 4000 in ESD stress environment may be reduced because of the resistance increases as a whole due to the presence of the silicide blocking region Z3 on the gate electrode and the source region of the semiconductor device 4000. Thus, the unique operation of the semiconductor device 4000 may be performed more securely in the ESD stress environment. The effect of preventing excessive concentration of current to the drain contact 72 and the bulk contact 74 may be maximized.

Figure 12:
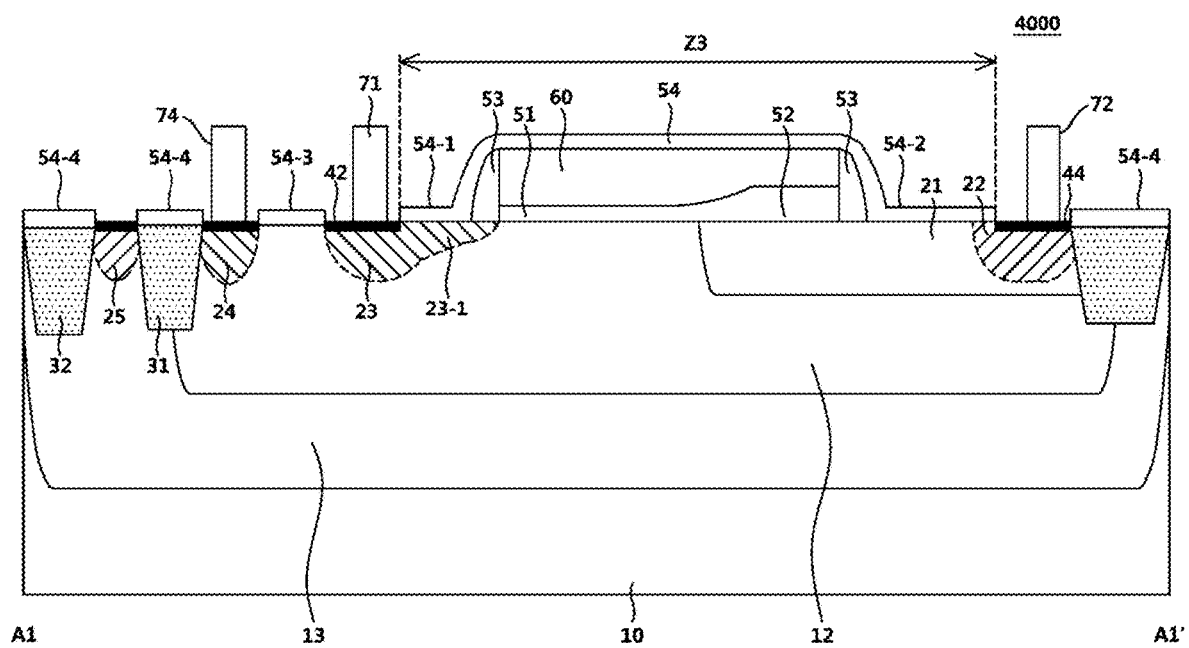
FIG. 12 is a cross-sectional view of an example of a semiconductor device, with respect to A1-A1' of FIG. 11.

FIG. 12 is a cross-sectional view of a semiconductor device according to the following description, with reference to A1-A1' of FIG. 11. For the convenience of explanation, differences from FIG. 4 will be mainly described.

A silicide blocking film 54-4 may be formed on the isolation regions 30, 31, and 32. A silicide blocking film 54-3 may be also formed between the source region 23 and the bulk region 24. This structure may have the largest silicide blocking film. The resistance between the gate electrode and the source region may be increased more than the structure illustrated in FIG. 4. Therefore, this structure may be more resistant to EOS failures than the structure illustrated in FIG. 4.

Figure 13:
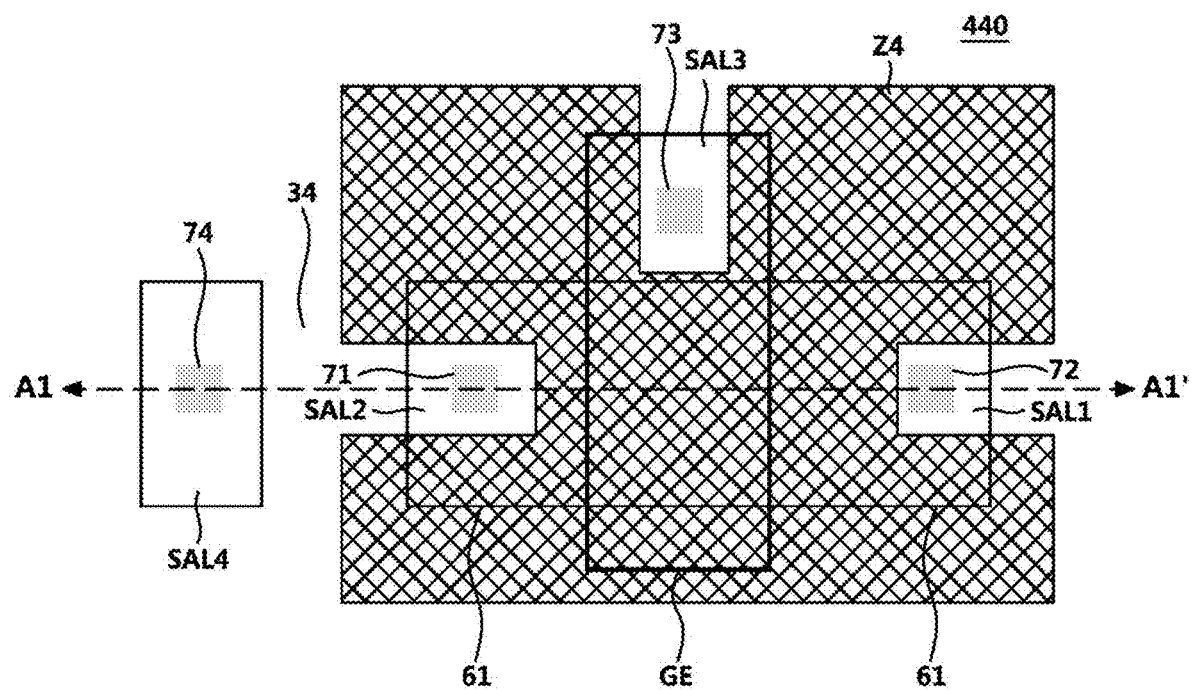
FIG. 13 is a mask layout for forming another example of a semiconductor device.

FIG. 13 is a mask layout for forming another example of an EDMOS semiconductor device.

Referring to FIG. 13, the entire silicide blocking region Z4 in a mask pattern 440 is not extended to the bulk contact block 74 and may be formed only on the top surface of a part of the source region 23, the gate electrode mask pattern GE and the drain region 22.

The entire silicide blocking region Z4 may be disposed so as to surround three sides of each of the gate silicide region SAL3, the source silicide region SAL2, and the drain silicide region SAL1. That is, the entire silicide blocking region Z4 may be formed in the source region 23, the gate electrode mask pattern GE, and the drain region 22 excluding the first conductive type well contact region 24. Therefore, excessive concentration of current to the contact 71, the gate contact 73, and the drain contact 72, excluding bulk contact 74, may be prevented.

As a result, according to the semiconductor device and the method of manufacturing the same of the present description, the current path between the gate and the source may be increased by disposing the silicide blocking region in a form of surrounding the gate contact. In addition, by increasing the current path between the gate and the source, EOS is not concentrated on the source side, thereby preventing damage to the semiconductor device.

According to the semiconductor device and the method of manufacturing the same of the following description, an expanded silicide blocking region may be disposed without an additional process.

Figure 14:
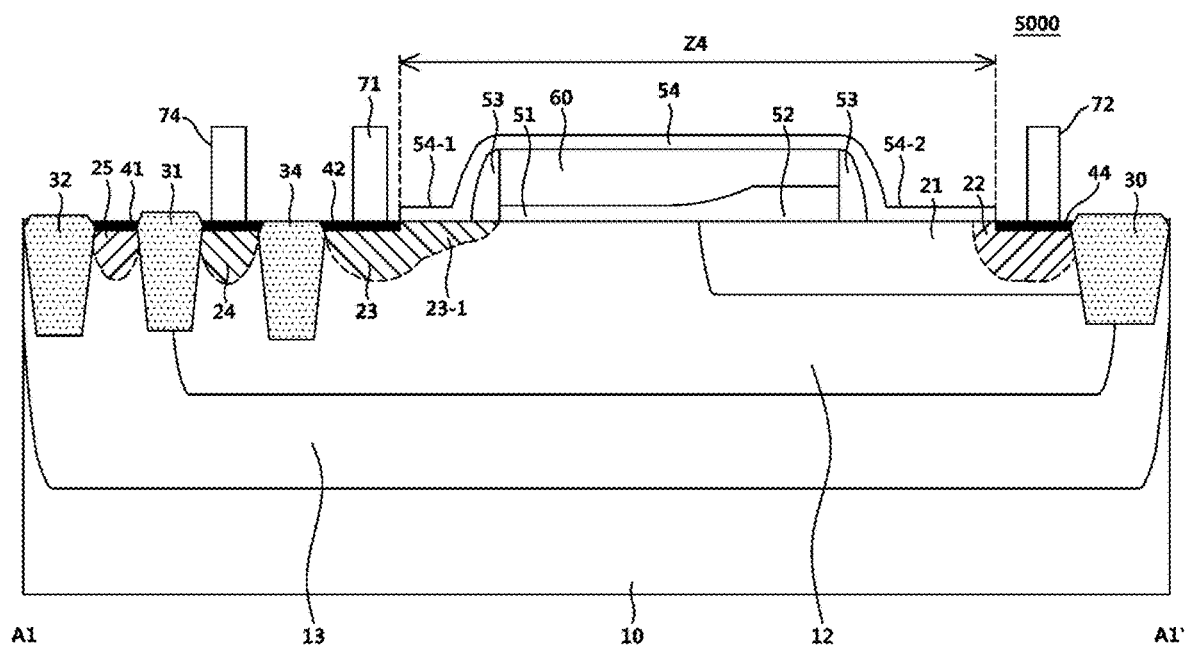
FIG. 14 is a cross-sectional view of a semiconductor device, with respect to A1-A1' of FIG. 13.

FIG. 14 is a cross-sectional view of an example of a semiconductor device according to the following description, taken along the line A1-A1' of FIG. 13. In the semiconductor device 5000 according to the example, the source region 23 and the bulk region 24 may be disposed so as not to be in contact with each other and may be spaced apart by the isolation region 34 constituted by STI, MTI, or the like. The reason for isolating the source region 23 and the bulk region 24 may be to apply different voltages respectively. For example, a ground voltage may be applied to the source region 23 and the voltage higher than the ground voltage may be applied to the bulk region 24.

According to the mask layout and the method for manufacturing a semiconductor device using the same, the resistance may be increased as a whole because of the presence of the silicide blocking region on the gate electrode and the source region in an nEDMOS semiconductor device.

According to the mask layout and the method of manufacturing a semiconductor device using of the same the present disclosure, the voltage applied between the gate electrode and the source region of an nEDMOS semiconductor device in an ESD stress environment may be reduced.

According to the mask layout and the method of manufacturing a semiconductor device using the same of the present disclosure, the unique operation of an nEDMOS semiconductor device may be performed more securely in the ESD stress environment.

According to the mask layout and the method of manufacturing a semiconductor device using the same of the present disclosure, an expanded silicide blocking region may be disposed without an additional process.

According to the mask layout and the method of manufacturing a semiconductor device using the same of the present disclosure, failures may be prevented from occurring in a level shifter block which is a Chip Core Block and has a more stable Level Shifter function.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A mask layout for forming a semiconductor device, comprising:
   an active mask pattern forming source and drain regions in a substrate;
   a gate electrode mask pattern, disposed to overlap the active mask pattern, forming a gate electrode between the source region and the drain region;
   a silicide blocking mask pattern comprising a body region and protruding regions extended from the body region, and disposed to overlap the gate electrode mask pattern and the active mask pattern to form a silicide blocking region in the gate electrode, the source region and the drain region; and
   a contact mask pattern, disposed spaced apart from the silicide blocking mask pattern, forming a contact plug on the substrate,
   wherein the silicide blocking mask pattern covers the gate electrode mask pattern and extends to the active mask pattern.

2. The mask layout for forming the semiconductor device of claim 1, wherein the silicide blocking region formed in the gate electrode is larger than a silicide region formed in the gate electrode.

3. The mask layout for forming the semiconductor device of claim 1, wherein the source region is simultaneously in contact with both a silicide region and the silicide blocking region.

4. The mask layout for forming the semiconductor device of claim 1, wherein the protruding regions comprise:
 a first protruding region disposed in the gate electrode and a portion of the source region to form a first protruding silicide blocking region; and
 a second protruding region disposed in the gate electrode and a portion of the drain region to form a second protruding silicide blocking region.

5. The mask layout for forming the semiconductor device of claim 4, wherein the protruding regions further comprise:
 a third protruding region protruded towards the drain region and disposed in contact with the second protruding region, and
 wherein a horizontal width of the third protruding region is smaller than a horizontal width of the body region.

6. The mask layout for forming the semiconductor device of claim 1, wherein the silicide blocking region is disposed from a top surface of the gate electrode and extends to a portion of a top surface of the source region.

7. A semiconductor device comprising:
 an active region defining an isolation region, a source region, and a drain region in a substrate;
 a gate electrode disposed, between the source region and the drain region, to overlap the active region; and
 a gate silicide region and a silicide blocking region disposed on the gate electrode, the silicide blocking region comprising a body region and a plurality of protruding regions extended from the body region,
 wherein a horizontal width of the body region is greater than a horizontal width of each protruding region.

8. The semiconductor device of claim 7, wherein the plurality of protruding regions comprises:
 a first protruding silicide blocking region disposed in the gate electrode and a portion of the source region; and
 a second protruding silicide blocking region disposed in the gate electrode and a portion of the drain region.

9. The semiconductor device of claim 8, wherein the plurality of protruding regions further comprises a third protruding silicide blocking region protruded towards the drain region, and
 wherein the silicide blocking region is disposed in contact with the second protruding silicide blocking region.

10. The semiconductor device of claim 7, wherein the body region is disposed to overlap the gate electrode, a portion of the source region, and a portion of the drain region.

11. The semiconductor device of claim 7, wherein the body region is disposed to overlap a portion of the gate electrode and the drain region.

12. The semiconductor device of claim 7, wherein an active mask pattern forms the source region and the drain region in the substrate.

13. The semiconductor device of claim 12, wherein a gate electrode mask pattern, disposed to overlap the active mask pattern, forms the gate electrode.

14. The semiconductor device of claim 13, wherein a silicide blocking mask pattern comprising a body region and protruding regions extended from the body region, and disposed to overlap the gate electrode mask pattern and the active mask pattern to form the silicide blocking region in the gate electrode, the source region and the drain region.

15. The semiconductor device of claim 14, wherein the silicide blocking mask pattern covers the gate electrode mask pattern and extends to the active mask pattern.

* * * * *